United States Patent
Reinschmidt

(10) Patent No.: US 7,196,550 B1
(45) Date of Patent: Mar. 27, 2007

(54) COMPLEMENTARY CMOS DRIVER CIRCUIT WITH DE-SKEW CONTROL

(75) Inventor: Robert M. Reinschmidt, Hollis, NH (US)

(73) Assignee: Cypress Semiconductor Corporation, San Jose, CA (US)

( * ) Notice: Subject to any disclaimer, the term of this patent is extended or adjusted under 35 U.S.C. 154(b) by 0 days.

(21) Appl. No.: 10/875,388

(22) Filed: Jun. 23, 2004

Related U.S. Application Data

(60) Provisional application No. 60/483,373, filed on Jun. 26, 2003.

(51) Int. Cl.
*H03K 19/094* (2006.01)

(52) U.S. Cl. .......................... 326/113; 326/86; 327/57; 327/55

(58) Field of Classification Search ................ 326/113; 327/57
See application file for complete search history.

(56) References Cited

U.S. PATENT DOCUMENTS

| | | | |
|---|---|---|---|
| 5,362,997 A | 11/1994 | Bloker | |
| 5,365,128 A * | 11/1994 | Bazes | .......................... 327/141 |
| 5,383,157 A | 1/1995 | Phelan | |
| 5,570,043 A | 10/1996 | Churchill | |
| 5,636,161 A | 6/1997 | Mann | |
| 5,705,921 A | 1/1998 | Xu | |
| 5,856,753 A | 1/1999 | Xu et al. | |
| 5,864,509 A | 1/1999 | Anumula | |
| 5,900,752 A | 5/1999 | Mar | |
| 5,986,489 A | 11/1999 | Raza et al. | |
| 6,249,466 B1 | 6/2001 | Ramakrishnan | |
| 6,378,008 B1 | 4/2002 | Gradinariu | |
| 6,469,548 B1 | 10/2002 | Huang et al. | |
| 6,529,036 B1 | 3/2003 | Rai | |
| 6,593,769 B1 | 7/2003 | Rai | |
| 6,791,370 B1 * | 9/2004 | Morzano | ...................... 327/57 |
| 6,870,776 B2 * | 3/2005 | Kim et al. | ............. 365/189.05 |
| 6,970,032 B1 | 11/2005 | Smith et al. | |

\* cited by examiner

*Primary Examiner*—Vibol Tan
(74) *Attorney, Agent, or Firm*—Brownstein Hyatt Farber Schreck, P.C.

(57) ABSTRACT

A circuit for driving a pair of input signals to form driven output signals while reducing the amount of skew between the driven output signals. In one embodiment, a driver circuit includes a first set of drivers connected in series and receiving the first input signal to produce a first output signal; a second set of drivers connected in series and receiving the second input signal to produce a second output signal; a first transmission gate connecting an input of one of the drivers from the first set of drivers to an output of one of the drivers of the second set of inverters; and a second transmission gate connecting an input of one of the drivers from the second set of drivers to an output of one of the drivers of the first set of drivers. Each transmission gate may be provided with a control for enabling or disabling the transmission gate, thereby permitting the selective application of the de-skew function of the circuit and providing for reduced power consumption when the de-skew function is disabled.

16 Claims, 2 Drawing Sheets

COMPLEMENTARY CMOS DRIVER CIRCUIT WITH DE-SKEW CONTROL

CROSS REFERENCE TO RELATED APPLICATION

This application claims priority under 35 U.S.C. 119(e) to U.S. Provisional Patent Application No. 60/483,373 entitled "COMPLEMENTARY CMOS DRIVER WITH DE-SKEW CONTROL" filed Jun. 26, 2003, the disclosure of which is hereby incorporated by reference in its entirety.

FIELD OF THE INVENTION

This invention relates to driver circuits.

BACKGROUND OF THE INVENTION

FIG. 1 illustrates a conventional circuit 10 for driving a pair of signals, such as complementary CMOS input signals "in_p" and "in_n". The circuit 10 includes a first set 12 of drivers or inverters inv1, inv2, inv3, inv4; and a second set 14 of drivers or inverters inv5, inv6, inv7, inv8. The output of the circuit of FIG. 1 includes two signals "out_p" and "out_n" that have been amplified and driven by the first or second set 12, 14 of inverters/drivers.

As recognized by the present inventor, in such a design of FIG. 1, any skew between the two input signals 16, 18 (such as a time delay or offset between the two input signals) will be transmitted to the outputs "out_p" and "out_n" because the two strings 12, 14 of drivers are independent. Also, to the extent that there are any process mismatches in the inverter/driver components (inv1, inv2, . . . inv8) or other signals components, or to the extent that there may be coupling of noise into one of the string of drivers which is not equally coupled into the other string of drivers, additional skew may appear at the outputs.

As recognized by the present inventor, what is needed is a circuit for driving complementary input signals through the use of drivers or inverters to produce complementary driven output signals while reducing the amount of skew between the driven output signals.

It is against this background that various embodiments of the present invention were developed.

SUMMARY

In light of the above and according to one broad aspect of one embodiment of the invention, disclosed herein is a circuit for driving a pair of input signals to form driven output signals while reducing the amount of skew between the driven output signals.

In one embodiment, a driver circuit includes a first set of drivers receiving a first signal to produce a first driven output signal, and a second set of drivers receiving a second signal to produce a second driven output signal. One or more cross coupling elements are provided to selectively connect the first set of drivers and the second set of drivers, thereby reducing the skew between the first driven output and the second driven output.

In another embodiment, a driver circuit includes a first set of drivers connected in series and receiving the first input signal to produce a first output signal; a second set of drivers connected in series and receiving the second input signal to produce a second output signal; a first transmission gate connecting an input of one of the drivers from the first set of drivers to an output of one of the drivers of the second set of inverters; and a second transmission gate connecting an input of one of the drivers from the second set of drivers to an output of one of the drivers of the first set of drivers.

The first transmission gate may include a pair of transistors connected in parallel between the input of one of the drivers from the first set of drivers to an output of one of the drivers of the second set of drivers. In another embodiment, the second transmission gate may include a pair of transistors connected in parallel between the input of one of the drivers from the second set of drivers to an output of one of the drivers of the first set of drivers.

Each transmission gate may be provided with a control for enabling or disabling the transmission gate, thereby permitting the selective application of the de-skew function of the circuit and providing for reduced power consumption when the de-skew function is disabled.

According to another broad aspect of another embodiment of the present invention, disclosed herein is a circuit comprising a first set of drivers receiving a first signal to produce a first driven output signal; a second set of drivers receiving a second signal to produce a second driven output signal; and at least one cross coupling element selectively connected between the first set of drivers and the second set of drivers for reducing the skew between the first driven output and the second driven output. In one example, the first set of drivers may include at least one inverter, and the second set of drivers may include at least one inverter. The first or second set of drivers may include at least one amplification element.

In another example, the at least one cross coupling element may include at least one transistor or a pair of transistors, or another number of transistors. In one embodiment, the at least one cross coupling element includes a pair of transistors coupled in parallel, a first transistor of the pair of transistors being a n-channel transistor, and a second transistor of the pair of transistors being a p-channel transistor. In one example, the at least one cross coupling element is disconnected when the first and second signals are in the same logic state.

In another embodiment, the first set of drivers includes a first inverter and a second inverter, the first inverter receiving the first signal, the first inverter coupled in series with the second inverter, the second inverter producing the first driven output signal; the second set of drivers includes a third inverter and a fourth inverter, the third inverter receiving the second signal, the third inverter coupled in series with the fourth inverter, the fourth inverter producing the second driven output signal; and the at least one cross coupling element includes a first pair of transistors connected in parallel and connected between the first signal set and the second driven output signal.

According to another broad aspect of another embodiment of the present invention, disclosed herein is a driver circuit having first and second input signals that are complementary. In one example, the driver circuit may include a first input signal; a first set of drivers connected in series and receiving the first input signal to produce a first output signal; a second input signal; a second set of drivers connected in series and receiving the second input signal to produce a second output signal; a first transmission gate connecting an input of one of the drivers of the first set of drivers to an output of one of the drivers of the second set of drivers; and a second transmission gate connecting an input of one of the drivers from the second set of drivers to an output of one of the drivers of the first set of drivers.

In one embodiment, the first transmission gate includes at least one transistor, or may include a pair of transistors connected in parallel between the input of one of the drivers from the first set of drivers to the output of one of the drivers of the second set of drivers. In another example, the second transmission gate includes a pair of transistors connected in parallel between the input of one of the drivers from the second set of drivers to the output of one of the drivers of the first set of drivers. In one example, the first set of drivers may include at least one inverter and the second set of drivers may include at least one inverter, or the first or second set of drivers may include at least one amplification element.

In another example, the circuit may also include a control signal, wherein the first and second transmission gates are selectively enabled and disabled by the control signal.

According to another broad aspect of another embodiment of the present invention, disclosed herein is a method of reducing skew between a pair of complementary signals. In one example, the method may include providing a first set of drivers receiving a first signal to produce a first driven output signal; providing a second set of drivers receiving a second signal to produce a second driven output signal, the second driven output signal being a complement of the first driven output signal; and providing for selectively connecting the first set of drivers and the second set of drivers for reducing the skew between the first driven output and the second driven output.

In one example, the operation of providing a first set of drivers may include providing a plurality of inverters coupled in series, and the operation of providing a second set of drivers may include providing a plurality of inverters coupled in series.

The features, utilities and advantages of the various embodiments of the invention will be apparent from the following more particular description of embodiments of the invention as illustrated in the accompanying drawings.

DETAILED DESCRIPTION

As will be explained below, embodiments of the invention provide for driving a pair of input signals, such as complementary signals or differential signals, while reducing the skew between the driven output signals. Various embodiments of the present invention will now be described.

Figure 1:
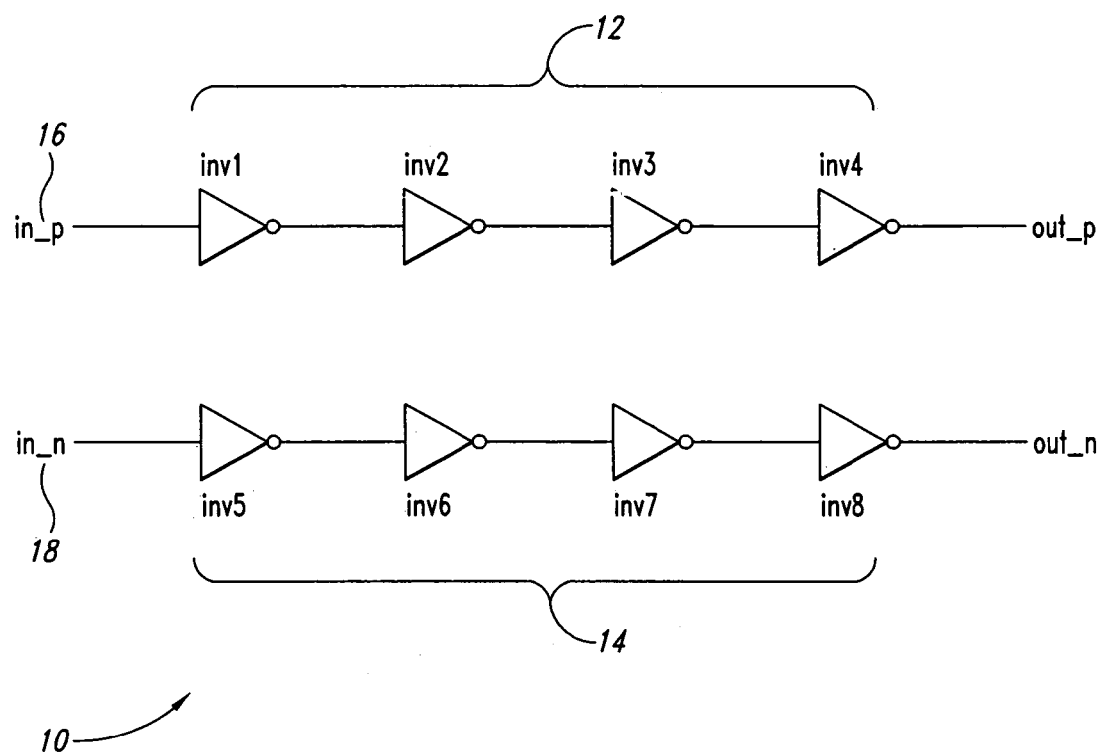
FIG. 1 illustrates a conventional circuit for driving input signals "in_p" and "in_n" to form driven output signals "out_P" and "out_n."
Figure 2:
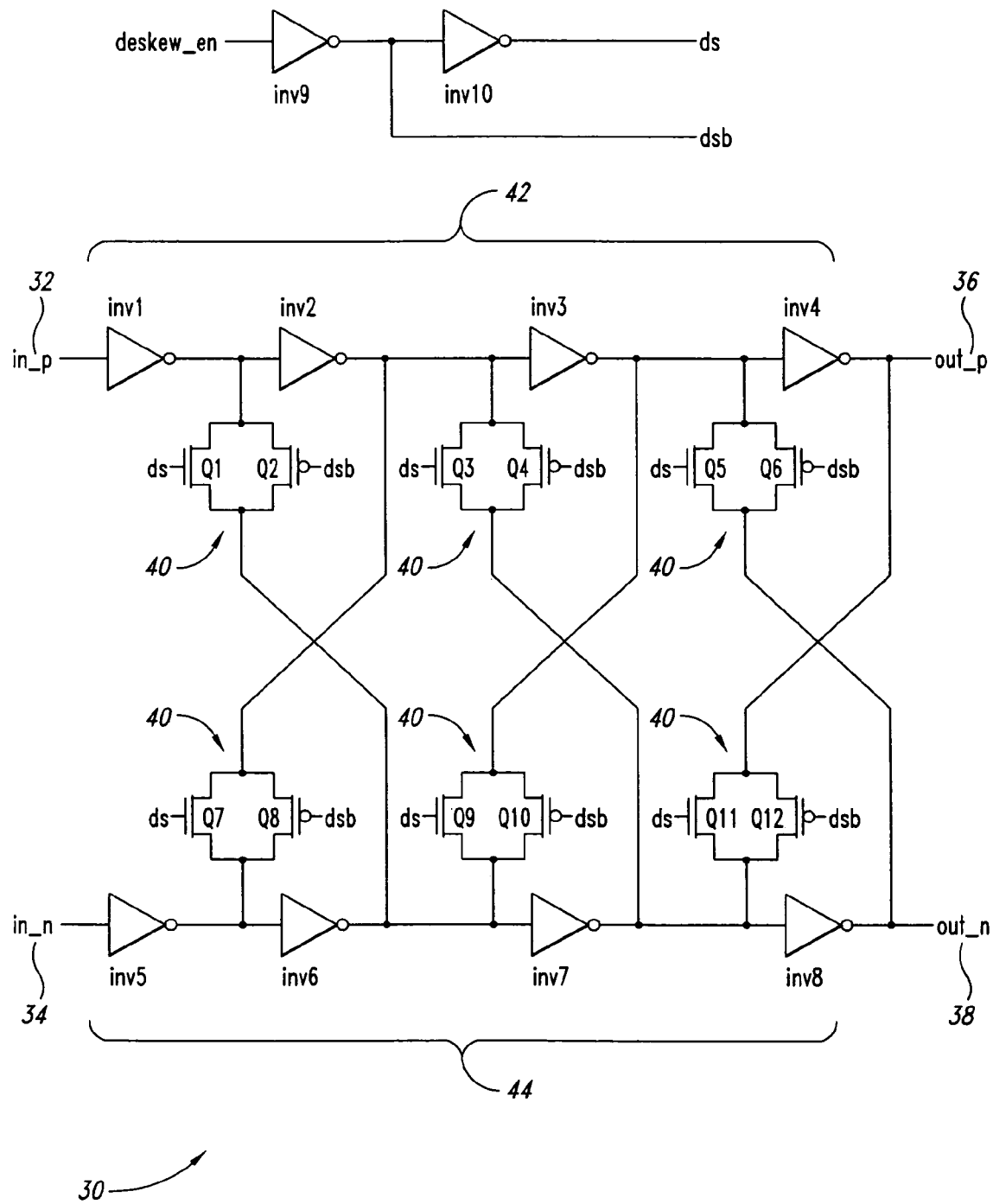
FIG. 2 illustrates an example of a circuit in accordance with an embodiment of the present invention.

FIG. 2 illustrates an example of a circuit 30 for driving input signal 32, 34 (such as IN_P and IN_N) to form driven output signals 36, 38 (such as OUT_P and OUT_N) in accordance with one embodiment of the present invention. A complementary input signal pair IN_P and IN_N (32, 34) may have some skew between the two signals, and embodiments of the present invention may translate the input signal 32, 34 to the output signal pair OUT_P and OUT_N (36, 38) with a reduced amount of skew between the two edges of the output signals 36, 38. Further, embodiments of the present invention can act as an amplifier that can amplify a weak input signal IN_P and IN_N. Through a number of stages of increasingly larger inverters, the input signal is amplified to be able to drive a much larger load. Also, in one example, embodiments of the present invention may have a normal mode and a mode that where output is selectively disabled, and this mode can be used for a low-power operations, for instance where the inputs IN_P and IN_N are both in the low/zero state and therefore the output signals OUT_P and OUT_N are both in low/zero state. Hence, in one mode of operation the input and output signals are differential, and the other mode of operation the input signals and the output signals are both in the zero state, in one example.

Through the use of embodiments of the present invention, skew between the input signals IN_P and IN_N may be reduced. In normal operation, the input signals IN_P and IN_N are complementary inputs so they are in the opposite state from one another. For example, the inputs to inverter INV1 and inverter INV5 are at opposite states and their outputs would be opposite. In this mode, the deskew enable input signal (DESKEW_EN) is high which turns on all of the transmission gates/cross-coupling devices 40 which provide positive feedback between the inverter pairs.

Generally, a set of inverter strings 42, 44 is provided for each input signal 32, 34. In one example, a first set 42 of inverters includes inverters INV1, INV2, INV3, and INV4, where inverter INV1 is coupled with the input signal IN_P and inverter INV4 provides the output signal OUT_P. A second set 44 of inverters includes inverters INV5, INV6, INV7, and INV8, where inverter INV5 is coupled with the input signal IN_N and inverter INV8 provides the output signal OUT_N.

A set of transmission gates or cross-coupling elements 40 is provided. In one example, the set of transmission gates includes sets of transistors, such as Q1/Q2, Q7/Q8, Q3/Q4, Q9/Q10, Q5/Q6, and Q11/Q12 as shown in FIG. 2. The transmission gates 40 are connected to cross-couple the two inverter strings 42, 44 in order to provide positive feedback. The sizing of the transmission gate transistors is such to ensure the gates switch with sufficient margin under process/voltage/temperature corners yet to provide adequate positive feedback coupling between the two inverter strings.

The gate nodes of the transmission gates 40 are connected to enabling signals shown as DS and its complement DSB. In this manner, when the enable signal DESKEW_EN is high, the transmission gates 40 (i.e., transistors Q1/Q2, Q7/Q8, Q3/Q4, Q9/Q10, Q5/Q6, and Q11/Q12) are on which provide the positive feedback coupling that de-skews the output signals. Positive feedback coupling between the two inverter strings 42, 44 greatly reduces skew at the output nodes. When the signal DESKEW_EN is low, the transmission gates are off, disabling the positive feedback.

Inverter pairs act as latches when the cross-coupling elements 40 are turned on. The inverter pairs that act as latches are, in one example, inverters INV2/INV6; inverters INV3/INV7; and inverters INV4/INV8. Inverters INV1 and INV5 are drivers that write the first latch formed by inverters INV2/INV6 and also ensure that the input to the circuit is high impedance. The succession of latches are written from one latch writing the following latch. Due to the positive feedback, any skew that exists at the input of one stage is reduced down along the successive stages until the output stage has little or no skew.

As used herein, the term "transistor" or "switch" includes any switching element which can include, for example, n-channel or p-channel CMOS transistors, MOSFETs, FETs, JFETS, BJTs, or other like switching element or device. The particular type of switching element used is a matter of choice depending on the particular application of the circuit, and may be based on factors such as power consumption limits, response time, noise immunity, fabrication considerations, etc. Hence while embodiments of the present invention are described in terms of p-channel and n-channel transistors, it is understood that other switching devices can be used, or that the invention may be implemented using the complementary transistor types.

In the embodiment of FIG. 2, complementary signals (i.e., CMOS signals) or differential pair signals 32, 34 are driven through a series of drivers or inverters 42, 44 for amplification and increased driving strength to create driven output signals. In this example, a first input signal IN_P is coupled with a first series 42 of drivers or inverters (INV1, INV2, INV3, INV4) that form a first corresponding driven output OUT_P. A second input signal IN_N is coupled through a second series 44 of drivers or inverters (INV5, INV6, INV7, INV8) to form a second output OUT_N corresponding to the second input.

In accordance with an embodiment of the invention, a plurality of cross-coupling elements/transmission gates 40 couples the first series 42 of drivers or inverters to the second series 44 of drivers inverters so as to reduce the skew between the first driven output OUT_P and the second driven output OUT_N.

Preferably, in one embodiment, an enable signal (in one example shown as DESKEW_EN) is provided which controls the cross-coupling elements 40 so that the cross-coupling elements can be disabled when not in use or unneeded so as to reduce the amount of current consumed by the cross-coupling elements of the circuits of FIG. 2.

While embodiments of the invention are described as using inverters in FIG. 2 (INV1, INV2, . . . INV10), it is understood that amplifiers, gain stages, or drivers or the like could be used in place of inverters or in addition to inverters. It is also understood that FIG. 2 is by way of example only, and that the number of inverters used may be varied depending upon the particular implementation.

In this example, the first series 42 of drivers/inverters includes inverter INV1 whose output is coupled in series with the input of inverter INV2, whose output is coupled with the input of inverter INV3, whose output is coupled with the input of inverter INV4, whose output forms the output driven signal OUT_P.

The second series 44 of drivers/inverters includes inverter INV5, whose output is coupled in series with the input of inverter INV6, whose output is coupled in series with the input of inverter INV7, whose output is coupled in series with the input of inverter INV8, whose output forms the output driven signal OUT_N.

Preferably, an enable signal shown as DESKEW_EN is coupled with the input of inverter INV9, whose output is coupled in series with the input of inverter INV10, and the output of inverter INV10 forms the control signal shown as DS that enables the de-skew feature of the circuit. The complement of the DS signal can be taken from the output of inverter INV9 and is shown in FIG. 2 as DSB. These signals DS and DSB are utilized to control and activate the cross-coupling elements connected between the series connection of inverters INV1–4 and inverters INV5–8, in one example.

As shown in FIG. 2, each transmission gate/cross-coupling element 40 may include a parallel combination of an n-channel transistor and a p-channel transistor which are coupled between the input of an inverter of a particular stage of one of the series of inverters to the output of an inverter of the next stage of the other series of inverters. For example, a first cross-coupling element/transmission gate is formed by the parallel combination of n-channel transistor Q1 and p-channel transistor Q2, wherein the drain of transistor Q1 and the source of transistor Q2 are coupled with the input of inverter INV2, while the source of transistor Q1 and the drain of transistor Q2 are coupled with the output of inverter INV6. The gate of transistor Q1 is coupled with the DS signal, while the gate of transistor Q2 is coupled with the DSB signal which is the complement of the DS signal.

Similarly, the drain of n-channel transistor Q3 and the source of p-channel transistor Q4 are coupled together with the input to inverter INV3, while the source of transistor Q3 and the drain of transistor Q4 are coupled together with the output of inverter INV7. The drain of n-channel transistor Q5 and the source of p-channel transistor Q6 are coupled with the input to inverter INV4, while the source of transistor Q5 and the drain of transistor Q6 are coupled with the output of inverter INV8.

As to the second series 44 of inverters, inverters INV5–8, the source of n-channel transistor Q7 and the drain of p-channel transistor Q8 are connected with the input of inverter INV6, while the drain of transistor Q7 and the source of transistor Q8 are coupled with the output of inverter INV2. As to transistors Q9, Q10, the source of n-channel transistor Q9 and the drain of p-channel transistor Q10 are coupled with the input of inverter INV7, while the drain of transistor Q9 and the source of transistor Q10 are coupled with the output of inverter INV3. As to transistors Q11, Q12, the source of n-channel transistor Q11 and the drain of p-channel transistor Q12 are coupled with the input of inverter INV8, while the drain of transistor Q11 and the source of transistor Q12 are coupled with the output of inverter INV4, as shown in FIG. 2.

In one example, for each cross-coupling element/transmission gate 40, the gate of the n-channel transistor of the cross-coupling element/transmission gate is coupled with the DS signal, while the gates of the p-channel transistor of the cross-coupling element/transmission gate is coupled with the DSB signal, which is the complement to the DS signal.

In another example, each transmission gate/cross coupling element 40 includes a single transistor or switch.

Preferably, the enable signal is capable of turning on and off the cross-coupling elements/transmission gates 40. In one example, the cross-coupling elements/transmission gates 40 are turned off to reduce the current consumed by the cross-elements/transmission gates whenever the input signals IN_P and IN_N are in the same logic state.

In the example of FIG. 2, the cross coupling provides positive feedback to the driver strings 42, 44. Preferably, the coupling is in pairs (for example, inverters INV2 and INV6 make a pair with positive feedback through transistors Q1, Q2, Q7 and Q8). The circuit can be made with any number of pairs of driver stages.

The positive feedback coupling between the first series/string 42 of inverters and the second series/string 44 of inverters reduces the skew between the output nodes OUT_P and OUT_N.

According to another broad aspect of another embodiment of the present invention, disclosed herein is a method of reducing skew between a pair of complementary signals. In one example, the method may include providing a first set of drivers receiving a first input signal to produce a first driven output signal. A second set of drivers may be provided to receive a second signal to produce a second driven output signal, the second driven output signal being a complement of the first driven output signal. The first set of drivers may be selectively coupled with the second set of drivers for reducing the skew between the first driven output and the second driven output. In one example, the operation of selectively coupling the first set of drivers with the second set of drivers provides at least one positive feedback connection therebetween.

In one example, the operation of providing a first set of drivers may include providing a plurality of inverters coupled in series, and the operation of providing a second set of drivers may include providing a plurality of inverters coupled in series.

Embodiments of the present invention may be used in various semiconductors, memories, processors, controllers, integrated circuits, logic or programmable logic, clock circuits, and the like. For instance, embodiments of the invention may be utilized in complementary clock drivers, or may be used to convert single ended signals to differential logic signals, such as for a LVDS (low voltage differential signal) output driver.

While the methods disclosed herein have been described and shown with reference to particular operations performed in a particular order, it will be understood that these operations may be combined, sub-divided, or re-ordered to form equivalent methods without departing from the teachings of the present invention. Accordingly, unless specifically indicated herein, the order and grouping of the operations is not a limitation of the present invention.

While the invention has been particularly shown and described with reference to embodiments thereof, it will be understood by those skilled in the art that various other changes in the form and details may be made without departing from the spirit and scope of the invention.

What is claimed is:

1. A circuit, comprising:
   a first set of drivers receiving a first signal to produce a first driven output signal;
   a second set of drivers receiving a second signal to produce a second driven output signal; and
   at least one cross coupling element selectively connected between the first set of drivers and the second set of drivers for reducing the skew between the first driven output and the second driven output,
   wherein the first set of drivers includes a first inverter and a second inverter, the first inverter receiving the first signal, the first inverter coupled in series with the second inverter, the second inverter producing the first driven output signal;
   wherein the second set of drivers includes a third inverter and a fourth inverter, the third inverter receiving the second signal, the third inverter coupled in series with the fourth inverter, the fourth inverter producing the second driven output signal; and
   wherein the at least one cross coupling element includes a first pair of transistors connected in parallel and connected between the first signal set and the second driven output signal.

2. The circuit of claim 1, wherein the first set of drivers includes at least one amplification element.

3. The circuit of claim 1, wherein the at least one cross coupling element includes a pair of transistors.

4. The circuit of claim 1, wherein the at least one cross coupling element includes a pair of transistors coupled in parallel, a first transistor of said pair of transistors being a n-channel transistor, and a second transistor of said pair of transistors being a p-channel transistor.

5. The driver circuit of claim 1, wherein the at least one cross coupling element is disconnected when the first and second signals are in the same logic state.

6. A driver circuit, comprising:
   a first input signal;
   a first set of drivers connected in series and receiving the first input signal to produce a first output signal;
   a second input signal;
   a second set of drivers connected in series and receiving the second input signal to produce a second output signal;
   a first transmission gate connecting an input of one of the drivers of the first set of drivers to an output of one of the drivers of the second set of drivers; and
   a second transmission gate connecting an input of one of the drivers from the second set of drivers to an output of one of the drivers of the first set of drivers.

7. The circuit of claim 6, wherein the first transmission gate includes at least one transistor.

8. The driver circuit of claim 6, wherein the first transmission gate includes a pair of transistors connected in parallel between the input of one of the drivers from the first set of drivers to the output of one of the drivers of the second set of drivers.

9. The driver circuit of claim 6, wherein the second transmission gate includes a pair of transistors connected in parallel between the input of one of the drivers from the second set of drivers to the output of one of the drivers of the first set of drivers.

10. The driver circuit of claim 6, wherein the first set of drivers includes at least one inverter.

11. The driver circuit of claim 6, wherein the second set of drivers includes at least one inverter.

12. The driver circuit of claim 6, wherein the first set of drivers includes at least one amplification element.

13. The driver circuit of claim 6, further comprising:
    a control signal;
    wherein the first and second transmission gates are selectively enabled and disabled by the control signal.

14. A method of reducing skew between a pair of complementary signals, comprising:
    providing a first set of drivers receiving a first signal to produce a first driven output signal;
    providing a second set of drivers receiving a second signal to produce a second driven output signal, the second driven output signal being a complement of the first driven output signal; and
    providing for selectively connecting the first set of drivers and the second set of drivers for reducing the skew between the first driven output and the second driven output,
    wherein the operation of providing for selectively connecting further comprises
      providing a first transmission gate connecting an input of one of the drivers of the first set of drivers to an output of one of the drivers of the second set of drivers, and
      providing a second transmission gate connecting an input of one of the drivers from the second set of drivers to an output of one of the drivers of the first set of drivers.

15. The method of claim 14, wherein the operation of providing a first set of drivers includes providing a plurality of inverters coupled in series.

16. The method of claim 14, wherein the operation of providing a second set of drivers includes providing a plurality of inverters coupled in series.

* * * * *